United States Patent
Hegedus

(10) Patent No.: US 9,733,280 B2
(45) Date of Patent: Aug. 15, 2017

(54) BALANCING AN EDDY CURRENT EFFECT AND A SKIN EFFECT ON A MAGNETIC SENSOR USING DIE PADDLE NOTCHES

(71) Applicant: Infineon Technologies AG, Neubiberg (DE)

(72) Inventor: Ákos Hegedus, Villach (AT)

(73) Assignee: Infineon Technologies AG, Neubiberg (DE)

(*) Notice: Subject to any disclaimer, the term of this patent is extended or adjusted under 35 U.S.C. 154(b) by 79 days.

(21) Appl. No.: 14/847,392

(22) Filed: Sep. 8, 2015

(65) Prior Publication Data
US 2017/0067941 A1    Mar. 9, 2017

(51) Int. Cl.
*G01R 15/20*    (2006.01)
*G01R 19/00*    (2006.01)

(52) U.S. Cl.
CPC ......... *G01R 15/207* (2013.01); *G01R 15/202* (2013.01); *G01R 15/205* (2013.01); *G01R 19/0092* (2013.01)

(58) Field of Classification Search
CPC ...... G01R 15/20; G01R 21/08; G01R 33/075; G05G 2009/04755; G06G 7/162
See application file for complete search history.

(56) References Cited

U.S. PATENT DOCUMENTS

| | | | | |
|---|---|---|---|---|
| 4,517,513 A * | 5/1985 | Brown | ............ | H04M 3/30 324/117 R |
| 2001/0052780 A1 | 12/2001 | Hayat-Dawoodi | | |
| 2010/0156394 A1* | 6/2010 | Ausserlechner | ..... | G01R 15/202 324/144 |
| 2011/0133732 A1 | 6/2011 | Sauber | | |
| 2011/0234215 A1* | 9/2011 | Ausserlechner | ....... | G01R 15/20 324/244 |
| 2011/0248711 A1* | 10/2011 | Ausserlechner | ..... | G01R 15/207 324/251 |
| 2012/0146165 A1* | 6/2012 | Ausserlechner | ..... | G01R 15/202 257/421 |
| 2013/0008022 A1* | 1/2013 | Yao | ............ | G01R 33/09 29/830 |
| 2013/0265041 A1* | 10/2013 | Friedrich | ............ | G01R 15/207 324/260 |

* cited by examiner

*Primary Examiner* — Patrick Assouad
*Assistant Examiner* — Demetrius Pretlow
(74) *Attorney, Agent, or Firm* — Harrity & Harrity, LLP

(57) ABSTRACT

A magnetic current sensor may include a first sensing element, a second sensing element, and a die paddle. The die paddle may include a first edge and a second edge substantially parallel to a direction of the current. The die paddle may include a first notch, extending from the first edge in a direction of the first sensing element, with a first width in a range of approximately 50 percent to approximately 100 percent of a distance between the first edge and the first sensing element. The die paddle may include a second notch, extending from the second edge in a direction of the second sensing element, with a second width in a range of approximately 50 percent to approximately 100 percent of a distance between the second edge and the second sensing element.

20 Claims, 11 Drawing Sheets

BALANCING AN EDDY CURRENT EFFECT AND A SKIN EFFECT ON A MAGNETIC SENSOR USING DIE PADDLE NOTCHES

BACKGROUND

A magnetic current sensor may determine an amount of current based on sensing a magnetic field, generated by the current, and based on the fact that the generated magnetic field is proportional to the amount of current. Since no galvanic coupling is needed, voltage isolation between a low voltage signal processing circuit and a high voltage current rail is possible up to several kilovolts.

SUMMARY

According to some possible implementations, a magnetic current sensor may include a first sensing element to sense a first magnetic field value associated with a current passing through a portion of a current rail; a second sensing element to sense a second magnetic field value associated with the current passing through the portion of the current rail; and a die paddle positioned above or below the first sensing element and the second sensing element, where the die paddle may have a first edge and a second edge substantially parallel to a direction of the current, the first edge being closer to the first sensing element than the second sensing element, and the second edge being closer to the second sensing element than the first sensing element, where the die paddle may include a first notch extending from the first edge in a direction of the first sensing element and having a first width in a range of approximately 50 percent to approximately 100 percent of a distance between the first edge and the first sensing element, and where the die paddle may include a second notch extending from the second edge in a direction of the second sensing element and having a second width in a range of approximately 50 percent to approximately 100 percent of a distance between the second edge and the second sensing element.

According to some possible implementations, a magnetic current sensor may include a first sensing element to determine a first magnetic field value associated with a current passing through a portion of a current rail; a second sensing element to determine a second magnetic field value associated with the current passing through the portion of the current rail; and a die paddle positioned above or below the first sensing element and the second sensing element, where the die paddle may have a first edge and a second edge substantially parallel to a direction of the current, the first edge being closer to the first sensing element than the second sensing element, and the second edge being closer to the second sensing element than the first sensing element, where the die paddle may include a first notch extending from the first edge in a direction substantially perpendicular to the direction of the current and having a first width that is less than a distance between the first edge and the first sensing element, and where the die paddle may include a second notch extending from the second edge in a direction substantially perpendicular to the direction of the current and having a second width that is less than a distance between the second edge and the second sensing element.

According to some possible implementations, a magnetic sensor may include a first sensing element to determine a first magnetic field value associated with a current passing through a portion of a current rail; a second sensing element to determine a second magnetic field value associated with the current passing through the portion of the current rail; and a die paddle positioned above or below the first sensing element and the second sensing element, where the die paddle may have a first edge and a second edge substantially parallel to a direction of the current, the first edge being closer to the first sensing element than the second sensing element, and the second edge being closer to the second sensing element than the first sensing element, where the die paddle may include a first notch extending from the first edge in a direction substantially perpendicular to the direction of the current and having a first width that is approximately 75 percent of a distance between the first edge and the first sensing element, and where the die paddle may include a second notch extending from the second edge in a direction substantially perpendicular to the direction of the current and having a second width that is approximately 75 percent of a distance between the second edge and the second sensing element.

DETAILED DESCRIPTION

Figure 1A:
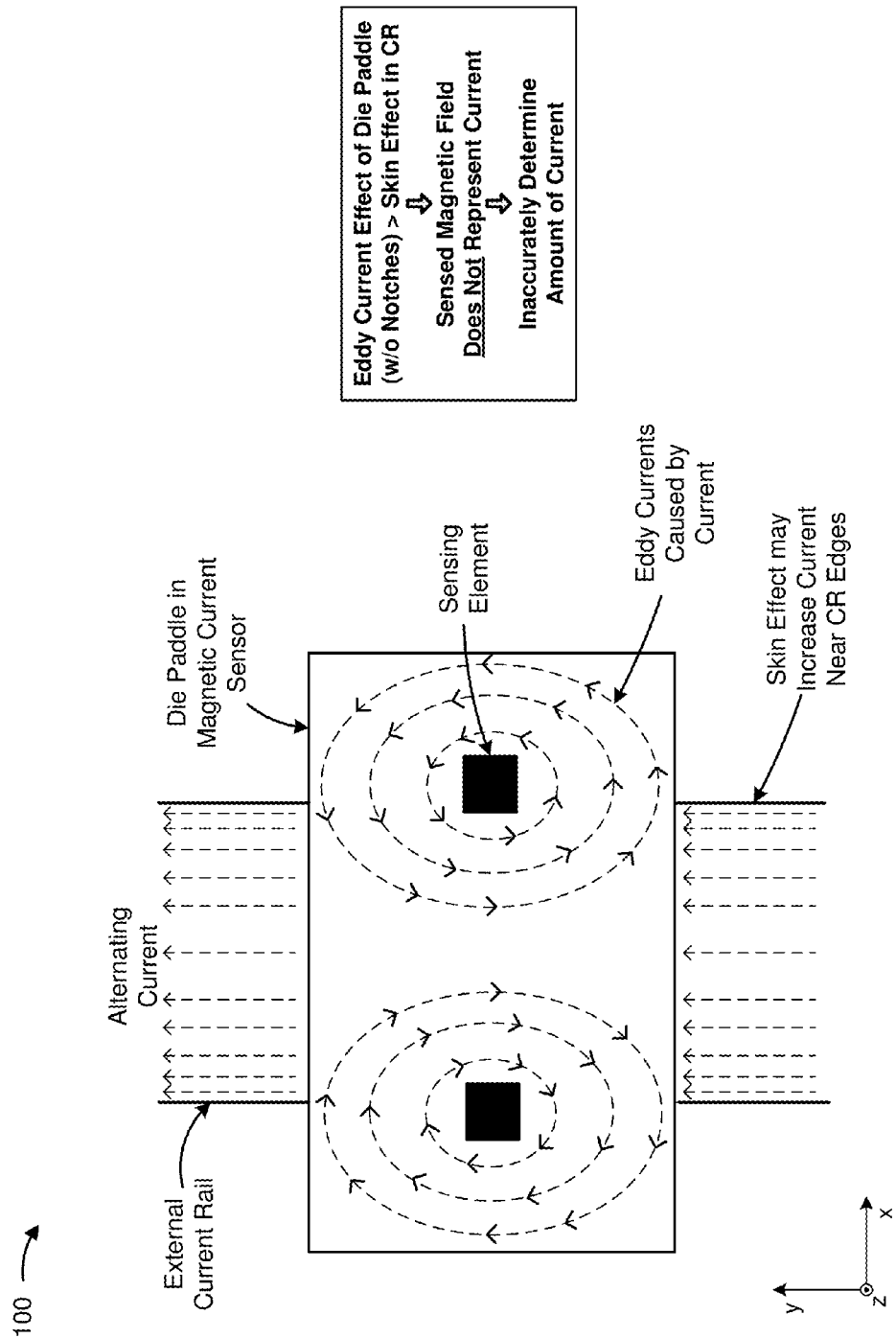
FIGS. 1A and 1B are diagrams of an overview of an example implementation described herein.

The following detailed description of example implementations refers to the accompanying drawings. The same reference numbers in different drawings may identify the same or similar elements.

A differential magnetic current sensor may make use of an external current rail (e.g., a trace on a printed circuit board (PCB) plate to which the magnetic current sensor is attached, positioned adjacent to, etc.) in order to determine the current passing through the current rail (e.g., to measure an amount of the current, to detect a change in direction of the current, to provide overcurrent protection, etc.). The magnetic current sensor may be positioned relative to and attached (e.g., soldered) to the current rail such that two or more sensing elements (e.g., lateral Hall cells included in the magnetic current sensor), mounted to a die paddle included in the magnetic current sensor, are located relative to opposite sides of the current rail. The sensing elements may sense opposite vertical magnetic fields (e.g., associated with a magnetic field generated by the current as the current passes through the current rail) and, based on intensities of the sensed opposite magnetic fields, may determine a differential magnetic field. The magnetic current sensor may then determine the current passing through the current rail based on the differential magnetic field. For example, the magnetic current sensor may modify a value representing the differential magnetic field using a gain factor (e.g., a factor associated with converting a differential magnetic field value to a current value) to determine the current passing through the current rail.

However, the differential magnetic field, sensed by the sensing elements, may be sensitive to an eddy current effect and/or a skin effect that results from an alternating current passing through the current rail. As such, due to the eddy current effect and/or the skin effect, the differential magnetic field, sensed by the sensing elements, may not accurately reflect the current passing through the current rail. In other words, the eddy current effect and/or the skin effect may prevent the magnetic current sensor from accurately determining the current passing through the current rail. For example, a step response of the magnetic current sensor (e.g., a response of the magnetic current sensor to a change in direction of the current) may be delayed.

With regard to the eddy current effect, the eddy currents may be induced in the die paddle around the sensing elements and may cause the measured differential magnetic field, sensed by the sensing elements, to be less than the actual differential magnetic field that corresponds to the current. In other words, the eddy currents may effectively reduce the amplitude of the differential magnetic field sensed by the sensing elements such that the sensing elements may not accurately sense the magnetic field corresponding to the current. Moreover, the effect of the eddy currents on the sensed magnetic field may increase as the frequency of the current increases (i.e., a higher frequency current may cause a greater eddy current effect on the sensed magnetic field). For example, the amplitude of the differential magnetic field may be increasingly reduced as the frequency of the alternating current increases. As another example, a phase shift of the differential magnetic field may occur as the frequency of the alternating current increases. This may result in limitations regarding an effective frequency bandwidth for which the magnetic current sensor may be used.

The skin effect may arise due to eddy currents in the current rail induced by an alternating magnetic field caused by the alternating current. As a result of the skin effect, a current density may be increased near the edges of the current rail (e.g., as compared to the center of the current rail). Therefore, the amplitude of the magnetic field near the edges of the current rail may increase as a consequence of the Biot-Savart Law. As such, the skin effect may cause the differential magnetic field, sensed by the sensing elements, to be greater than the differential magnetic field that corresponds to the same amount of current at lower frequencies and, thus, the sensed differential magnetic field may not accurately represent the current anymore with increasing frequency. Similar to the eddy current effect, the skin effect may also increase as the frequency of the current increases.

Implementations described herein may relate to a die paddle, included in a magnetic current sensor. The die paddle includes notches designed to reduce an eddy current effect in the die paddle, caused by a current passing through a current rail. It is preferred for this reduction of eddy current effect, to balance with a skin effect caused by the current passing through the current rail. As such, the magnetic current sensor may be able to accurately determine the current passing through the current rail in the presence of the eddy current effect and the skin effect. In some implementations, use of the notches may allow the magnetic current sensor to be substantially frequency independent in its characteristics, such that the magnetic current sensor may function even when measuring a high frequency current (e.g., in the range of up to several hundred kilohertz (kHz).

Figure 1B:
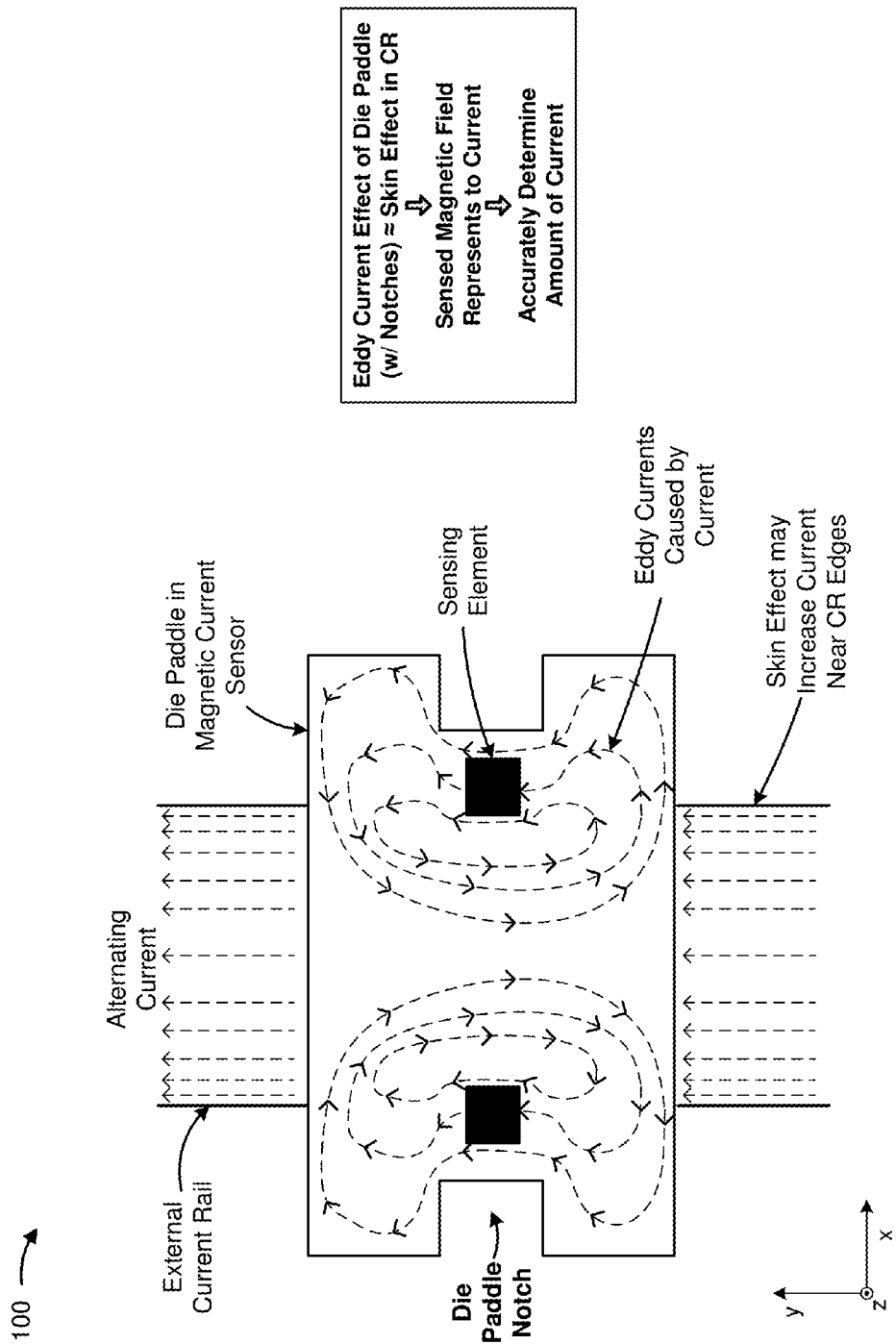

FIGS. 1A and 1B are diagrams of an overview of an example implementation 100 described herein. For the purposes of FIG. 1A, assume that a magnetic current sensor is attached in a position relative to an external current rail. Further, assume that the magnetic current sensor includes a pair of sensing elements (e.g., lateral Hall cells) mounted on a die paddle that does not include any notches.

As shown in FIG. 1A, at a particular instance of time, a current of specific magnitude, passing through the external current rail, may change or invert direction. The inversion of direction may be a singular event or happen due to the current running through the current rail being an alternating current. As shown, due to the switch in direction of the current, eddy currents may be induced in the die paddle. For example, as shown, the alternating current may cause eddy currents that surround the sensing elements included in the magnetic current sensor. As a result of the eddy currents, the intensity of the magnetic field seen by the sensing elements may be reduced. In other words, due to the eddy current effect, the sensing elements may be unable to accurately sense the amplitude of the magnetic field that represents the current. The eddy current effect may occur each time the alternating current switches direction.

As further shown, the alternating nature of the current may also cause the skin effect to be present in the current rail. As shown, due to the skin effect, a density of the current may be increased near the edges of the current rail. For example, as shown, the alternating current may cause the current to be more dense near the outer edges of the current rail (e.g., nearer to the sensing elements). As a result of the skin effect, the amplitude of the magnetic field, surrounding the sensing elements, may be increased. However, as noted, the eddy current effect works in the opposite direction. Therefore, depending on circumstances the skin effect may outweigh an effect of eddy currents or vice versa, such that the overall magnetic field does not accurately represent the magnetic field caused by the (alternating) current. As a consequence, since the amplitude of the magnetic field sensed by the sensing elements does not represent the (alternating) current, the magnetic current sensor may be unable to accurately determine the amount of current passing through the current rail. The skin effect may also occur each time the alternating current changes in magnitude and/or in direction.

Further, there may be a sweet spot at which the skin effect effectively balances the eddy current effect, as shall be discussed with regards to FIG. 1B.

For the purposes of FIG. 1B, assume that the magnetic current sensor is similar to that described with regard to FIG. 1A, but that the sensing elements are mounted to a die paddle that includes a pair of die paddle notches. As shown, eddy currents (loops of dashed lines with arrows indicating direction of eddy currents in die paddle of FIG. 1B) present in the notched die paddle when the (alternating) current switches direction, may be altered due to the notches of the die paddle. For example, as shown, the eddy current loops may be distorted by the notches such that the eddy currents are not centered on the sensing elements. In other words, the die paddle notches may cause the eddy current effect on the magnetic field, sensed by the sensing elements, to be reduced.

As shown, the skin effect may be present (e.g., to increase the amplitude of the magnetic field sensed by the sensing elements), close to edges of the current rail. However, there is a sweet spot, where the effect of the die paddle notches may cause the eddy current effect and the skin effect to be approximately balanced within the die paddle. As a consequence, the amplitude of the magnetic field, sensed by the sensing elements, will accurately represent the current. In other words, the die paddle notches may cause the eddy current effect to be at least partially reduced and therefore substantially offset by the skin effect. Therefore, the amplitude of the magnetic field, sensed by the sensing elements, may accurately represent the current, and the magnetic current sensor may accurately determine the (alternating) current passing through the current rail.

In some implementations, the die paddle notches may allow the magnetic current sensor to be frequency independent. For example, even with an alternating current of a relatively high frequency (e.g., greater than or equal to several kHz, several hundred kHz etc.), the die paddle notches may approximately balance the eddy current effect against the skin effect, which corresponds to the above mentioned sweet spot extending over a wide frequency range. Such an extension is of advantage, as one current sensor is now reliably usable over a wide range of frequencies, where in the past more than one current sensor may have been needed to cover the whole frequency range. As such, the die paddle notches may reduce a frequency dependence of the amplitude of the magnetic field or a phase shift of the magnetic field.

As such, a notched die paddle, included in a magnetic current sensor, may reduce an eddy current effect, caused by an (alternating) current passing through a current rail, such that the eddy current effect approximately balances a skin effect caused by the current passing through the current rail. Therefore, the magnetic current sensor including the notched die paddle may be able to accurately determine the (alternating) current passing through the current rail (e.g., to measure the amount of current, to detect a change in direction of the current, to provide overcurrent protection, etc.).

Figure 2:
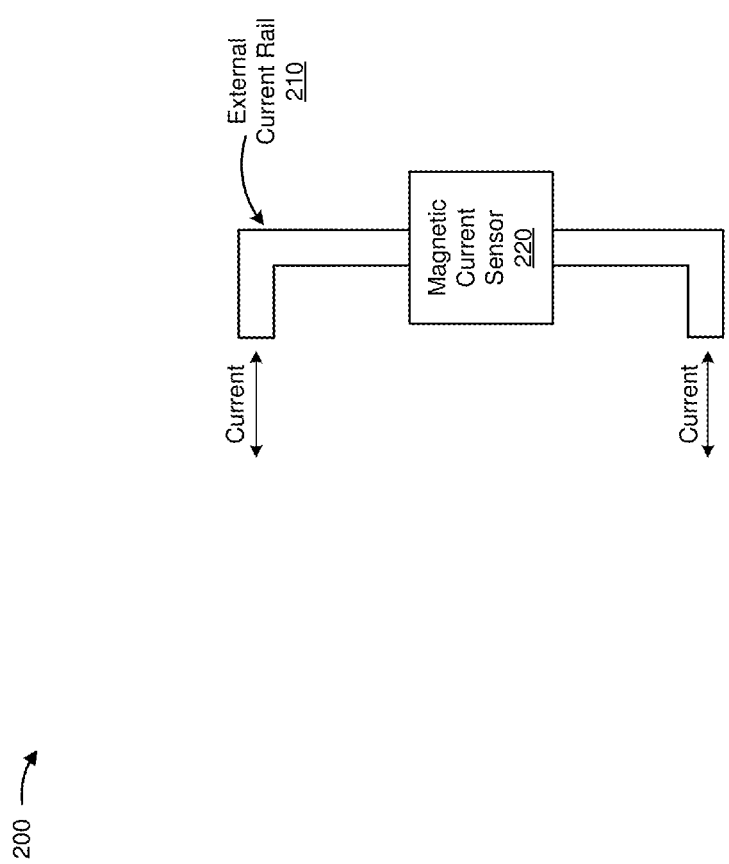
FIG. 2 is a diagram of an example environment in which apparatuses described herein may be implemented.

FIG. 2 is a diagram of an example environment 200 in which apparatuses described herein may be implemented. As shown in FIG. 2, environment 200 may include an external current rail 210 and a magnetic current sensor 220.

External current rail 210 may include an electrically conductive track between two or more electronic components. For example, external current rail 210 may include a trace on a PCB that connects two components of an electrical circuit. In some implementations, an alternating current may pass through external current rail 210 (e.g., from one electrical component to another electrical component, from a current source to an electrical component, etc.).

Magnetic current sensor 220 may include a sensor designed to determine a current passing through external current rail 210. For example, magnetic current sensor 220 may determine the current passing through external current rail 210 based on sensing a magnetic field generated by the current. In some implementations, magnetic current sensor 220 may be positioned such that magnetic current sensor 220 is separated from external current rail 210 by a galvanic isolation component. In some implementations, magnetic current sensor 220 may include a differential sensing component associated with sensing the magnetic field generated by the current, and one or more other components. Additional details regarding magnetic current sensor 220 are described below with regard to FIG. 3. In some implementations, magnetic current sensor 220 may be housed in package comprising a semiconductor chip.

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
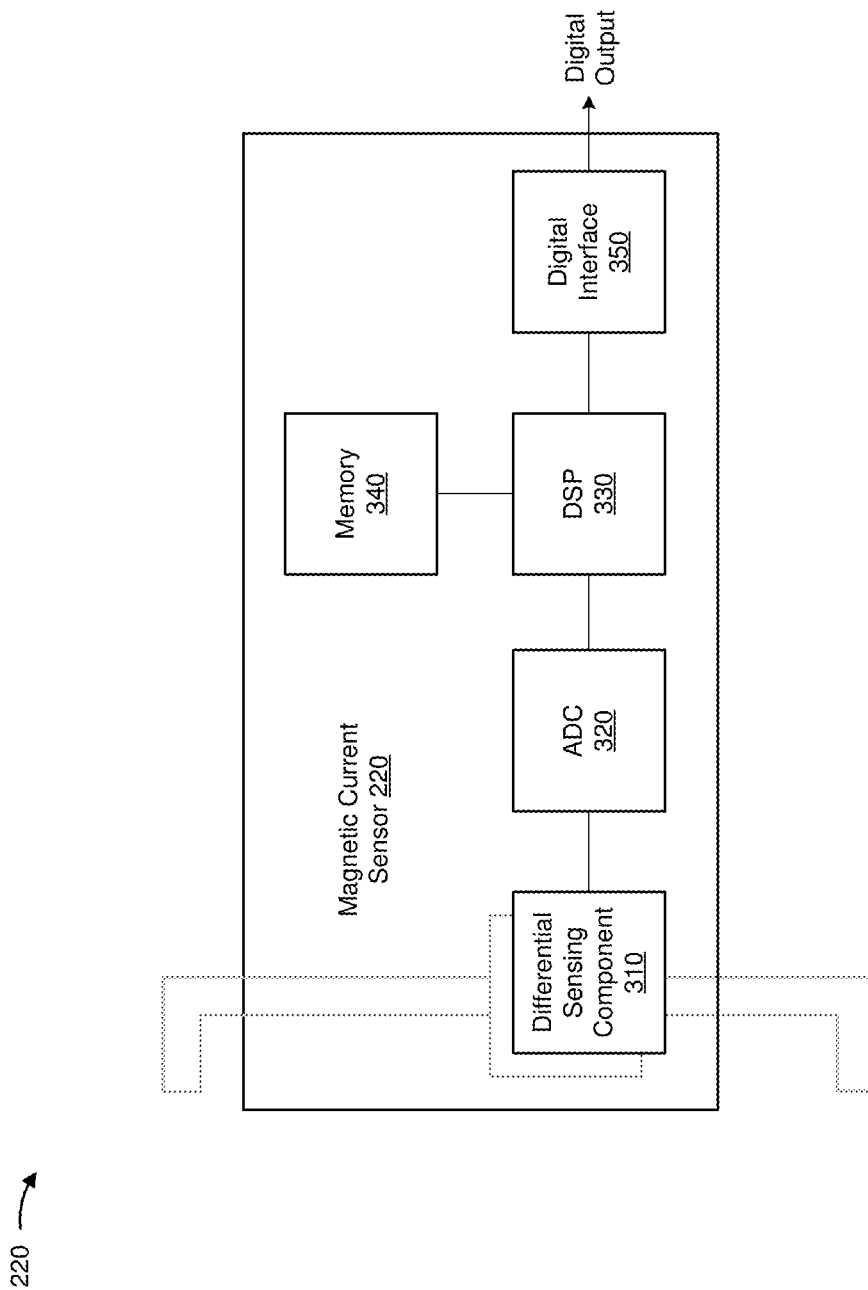
FIG. 3 is a diagram of example components of a magnetic current sensor included in the example environment of FIG. 2.

FIG. 3 is a diagram of example components of a magnetic current sensor 220 included in the example environment 200 of FIG. 2. As shown, magnetic current sensor 220 may include a differential sensing component 310, an analog-to-digital convertor (ADC) 320, a digital signal processor (DSP) 330, a memory component 340, and a digital interface 350.

Differential sensing component 310 may include a component designed to sense a magnetic field generated by a current passing through external current rail 210. In some implementations, differential sensing component 310 may include a pair of sensing elements (e.g., a pair of lateral Hall cells, a pair of vertical Hall cells, etc.) where each sensing element may be capable of sensing a magnetic field with opposing reference direction. In some implementations, each differential sensing component 310 may provide information associated with the sensed magnetic fields to ADC 320 (e.g., such that a differential magnetic field value may be determined for use in determining the current passing through the current rail). While the optional memory component 340 is only shown with a link to the DSP 330, it will be appreciated that the differential sensing component 310, the ADC 320, and/or the digital interface 350 may be linked to the memory component 340, in order to store some values or parameters useful for the operation of the differential sensing component 310, the ADC 320, and/or the digital interface 350. Additional details regarding differential sensing component 310 are described below with regard to FIG. 4.

ADC 320 may include an analog-to-digital converter that converts an analog signal (e.g., a voltage or current signal) from differential sensing component 310 to a digital signal. For example, ADC 320 may convert analog signals, received from differential sensing component 310, into digital signals to be processed by DSP 330. ADC 320 may provide the digital signals to DSP 330. In some implementations, magnetic current sensor 220 may include one or more ADCs 320.

DSP 330 may include a digital signal processing device or a collection of digital signal processing devices. In some implementations, DSP 330 may receive a digital signal from ADC 320 and may process the digital signal to form an output (e.g., information associated with the current passing through external current rail 210, etc.).

Memory 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by magnetic current sensor 220. In some implementations, memory component 340 may store information associated with processing performed by DSP 330.

Digital interface 350 may include an interface via which magnetic current sensor 220 may receive and/or provide information from and/or to another device, such as information associated with the current determined by magnetic current sensor 220. For example, digital interface may provide the output determined by DSP 330 that identifies an amount of current passing through external current rail 210, information associated with a change in direction of the current, information associated with providing overcurrent protection, or the like.

The number and arrangement of components shown in FIG. 3 are provided as an example. In practice, magnetic current sensor 220 may include additional components, fewer components, different components, or differently arranged components than those shown in FIG. 3. Additionally, or alternatively, a set of components (e.g., one or more components) of magnetic current sensor 220 may perform one or more functions described as being performed by another set of components of magnetic current sensor 220.

Figure 4:
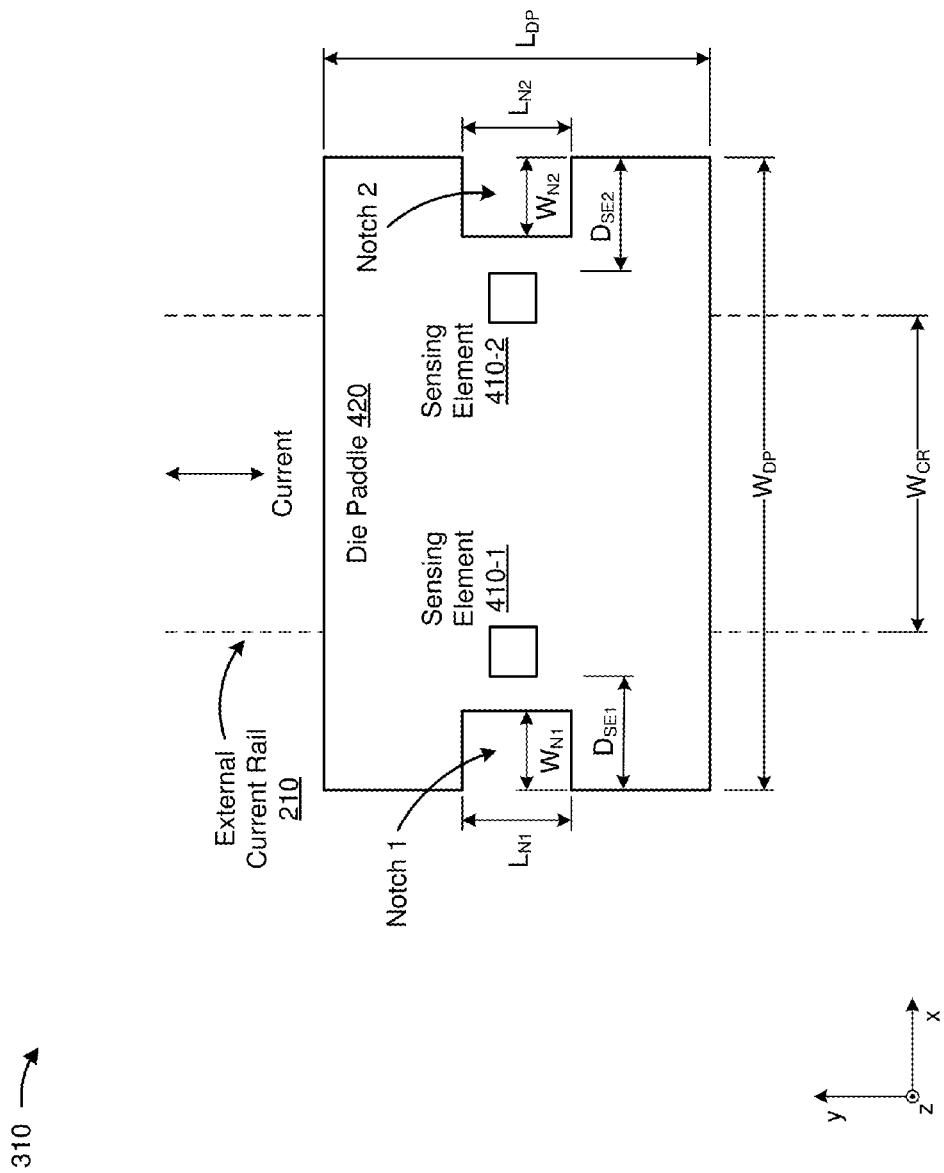
FIG. 4 is a diagram of example components of a differential sensing component included in the example magnetic current sensor of FIG. 3.

FIG. 4 is a diagram of example components of a differential sensing component 310 included in the example magnetic current sensor 220 of FIG. 3. As shown in FIG. 4, differential sensing component 310 may include a pair of sensing elements 410 (e.g., sensing element 410-1 and sensing element 410-2), and a die paddle 420.

Sensing elements 410 (sensing element 410-1, sensing element 410-2) may include a pair of transducers designed to provide outputs in response to sensing a magnetic field, in the present example caused by a current travelling through a portion of external current rail 210 above or below magnetic current sensor 220. For example, sensing elements 410 may provide outputs representing sensed magnetic field values that allow magnetic current sensor 220 to derive (e.g., based on magnetic field values provided by the two sensing elements 410-1, 410-2) a differential magnetic field that corresponds to the current passing through external current rail 210. In some implementations, sensing elements 410 may be positioned below or above die paddle 420, for example, sensing elements 410 may be included in an integrated circuit to which die paddle 420 is attached. In some implementations, sensing element 410 may sense the magnetic field based on a Hall effect, a giant magnetoresistance (GMR) effect, an anisotropic magnetoresistance (AMR) effect, a tunnel magnetoresistance (TMR) effect, or the like. In some implementations, a pair of sensing elements 410 may form a differential sensor.

Die paddle 420 may include a component associated with mounting and/or connecting one or more components of magnetic current sensor 220, such as sensing elements 410, an integrated circuit that includes sensing elements 410 and/or one or more other components of magnetic current sensor 220, or the like. In some implementations, die paddle 420 may be constructed of an electrically conductive material, such as copper, a copper alloy, or the like.

As shown in FIG. 4, in some implementations, die paddle 420 may have a die paddle width in a first direction (e.g., $W_{DP}$ in an x-direction in FIG. 4) that is substantially (e.g., within one degree, within five degrees, etc.) perpendicular to the current passing through external current rail 210 (e.g., a portion of external current rail 210 over or under which magnetic current sensor 220 is attached). As further shown, die paddle 420 may also have a die paddle length in a second direction (e.g., $L_{DP}$ in a y-direction in FIG. 4) that is substantially parallel to the current passing through external current rail 210. Furthermore, die paddle 420 may have a die paddle height in a third direction (e.g., $H_{DP}$ (not shown) in a z-direction).

As shown, die paddle 420 may also include a first die paddle notch (e.g., notch 1) and a second die paddle notch (e.g., notch 2) associated with reducing an effect of eddy currents, induced in die paddle 420, on the magnetic field sensed by sensing elements 410. As shown, the first notch and the second notch may extend from respective edges of die paddle 420 for a width (e.g., $W_{N1}$, $W_{N2}$) in the first direction and a length in the second direction (e.g., $L_{N1}$, $L_{N2}$), and may extend through the entire height of die paddle 420.

In some implementations, as shown in FIG. 4, a notch width may be less than a distance between an edge of die paddle 420 and a sensing element 410 (e.g., a center of sensing element 410). For example, as shown, the width of the first notch (e.g., $W_{N1}$) may be less than a distance between a first edge of die paddle 420 (e.g., an edge that is substantially parallel to the current passing through external current rail 210) and sensing element 410-1 (e.g., $D_{SE1}$). As another example, as shown, the width of the second notch (e.g., $W_{N2}$) may be less than a distance between a second edge of die paddle 420 (e.g., another edge that is substantially parallel to the current passing through external current rail 210, and opposite the first edge) and sensing element 410-2 (e.g., $D_{SE2}$). In some implementations, the width of a notch may be less than the distance to a sensing element 410, as described in the above examples (e.g., $W_{N1} < D_{SE1}$, $W_{N2} < D_{SE2}$). For example, the width of the notch may be approximately equal to 75% of the distance to a sensing element 410 (e.g., $W_{N1} \approx 0.75 \times D_{SE1}$, $W_{N2} \approx 0.75 \times D_{SE2}$). As another example, the width of the notch be between 50% of the distance to a sensing element 410 and 100% of the distance to the sensing element 410 (e.g., $0.50 \times D_{SE1} < W_{N1} < D_{SE1}$, $0.50 \times D_{SE2} < W_{N2} < D_{SE2}$).

In some implementations, the first notch and the second notch may be substantially identical with respect to each other (e.g., $W_{N1} \approx W_{N2}$, $L_{N1} \approx L_{N2}$). Alternatively, the first notch and the second notch may not be identical (e.g., the first notch and the second notch may be of two different shapes). Additionally, or alternatively, the first notch and the second notch may be similarly positioned along the first edge of die paddle 420 and the second edge die paddle 420, respectively, relative to two other edges of die paddle 420 that are substantially perpendicular to the direction of the current passing through the current rail (e.g., the first notch and the second notch may be similarly positioned along the y-axis as shown in FIG. 4). In some implementations, as shown in FIG. 4, the first notch and/or the second notch may be rectangular in shape. Alternatively, the first notch and the second notch may be another shape, such as a triangle, a half circle, a square, or the like.

In some implementations, the first notch and the second notch may be designed to reduce the effect of eddy currents on the magnetic field amplitude sensed by sensing elements 410. For example, in some implementations, the first notch and the second notch may be designed to cause some or all of the eddy current effect to balance with (e.g., cancel out, offset, etc.) the skin effect caused by the current passing through external current rail 210 leading to higher current densities at the edges of the current rail 210, as explained above.

In some implementations, reducing the effect of the eddy currents to balance with the skin effect may allow magnetic current sensor 220 to suffer substantially no frequency bandwidth limitation due to eddy-current effect, as described below with regard to graphical representations 700. For example, in the case of an intact die paddle (e.g., a die paddle without notches) as described above, the eddy current effect may reduce an amplitude of the differential magnetic field (e.g., sensed by sensing elements 410) as a frequency of the current passing through the current rail increases. Here, the non-sinusoidal current may be viewed as a sum of sinusoidal components, where each sinusoidal component may suffer a distortion depending on its frequency. At some frequencies (e.g., greater than or equal to 1 kHz, greater than or equal to 100 kHz, greater than or equal to 10 MHz, etc.), the eddy current effect may cause the amplitude of the magnetic field to inaccurately represent the current. In a case when die paddle 420 includes a pair of notches designed to cause the eddy current effect to balance with the skin effect, the amplitude of the magnetic field (e.g., sensed by sensing elements 410) may accurately represent the current passing through external current rail 210 (e.g., within a higher frequency range than a frequency range when die paddle 420 does not include notches). Moreover, when die paddle 420 includes the pair of notches designed to reduce the eddy current effect to balance with the skin effect, a phase shift of the magnetic field, caused by the eddy current effect, may be reduced.

In some implementations, a width of a notch (e.g., as shown by $W_{N1}$ or $W_{N2}$ in FIG. 4) may be determined based on a set of geometrical factors associated with die paddle 420 and/or external current rail 210. For example, the width of the notch (e.g., the first notch and/or the second notch) may be determined based on a width of die paddle 420, a length of die paddle 420, a height of die paddle 420, a width of a portion of external current rail 210 over or under which die paddle 420 is mounted, a height of the portion of external current rail, a distance between sensing elements 410 within magnetic current sensor 220, a distance between die paddle 420 and the portion of external current rail, a distance between die paddle 420 and sensing elements 410, or the like.

Additionally, or alternatively, the width of the notch may be determined based on a set of material factors associated with die paddle 420 and/or external current rail 210. For example, the width of the notch may be determined based on an electrical conductivity of a material from which die paddle 420 is constructed, a magnetic permeability of the material from which die paddle 420 is constructed, a conductivity of a material from which the portion of external current rail 210 is constructed, a magnetic permeability of the material from which the portion of external current rail 210 is constructed, or the like.

In some implementations, the width of the notch and/or the length of the notch may be determined, based on the set of geometrical factors and/or the set of material factors, using a numerical technique for finding approximate solutions to boundary value problems for partial differential equations, such as the Finite Element Method.

In some implementations, the pair of notches may not compromise a structural stability of die paddle 420 since, for example, the notches may not substantially traverse die paddle 420 and/or may not be positioned such that the notches form an irregular shaped notch, such as a T-shaped notch, an L-shaped notch, or the like.

The number and arrangement of components shown in FIG. 4 are provided as an example. In practice, differential sensing components 410 may include additional components, different components, or differently arranged components than those shown in FIG. 4.

Figure 5A:
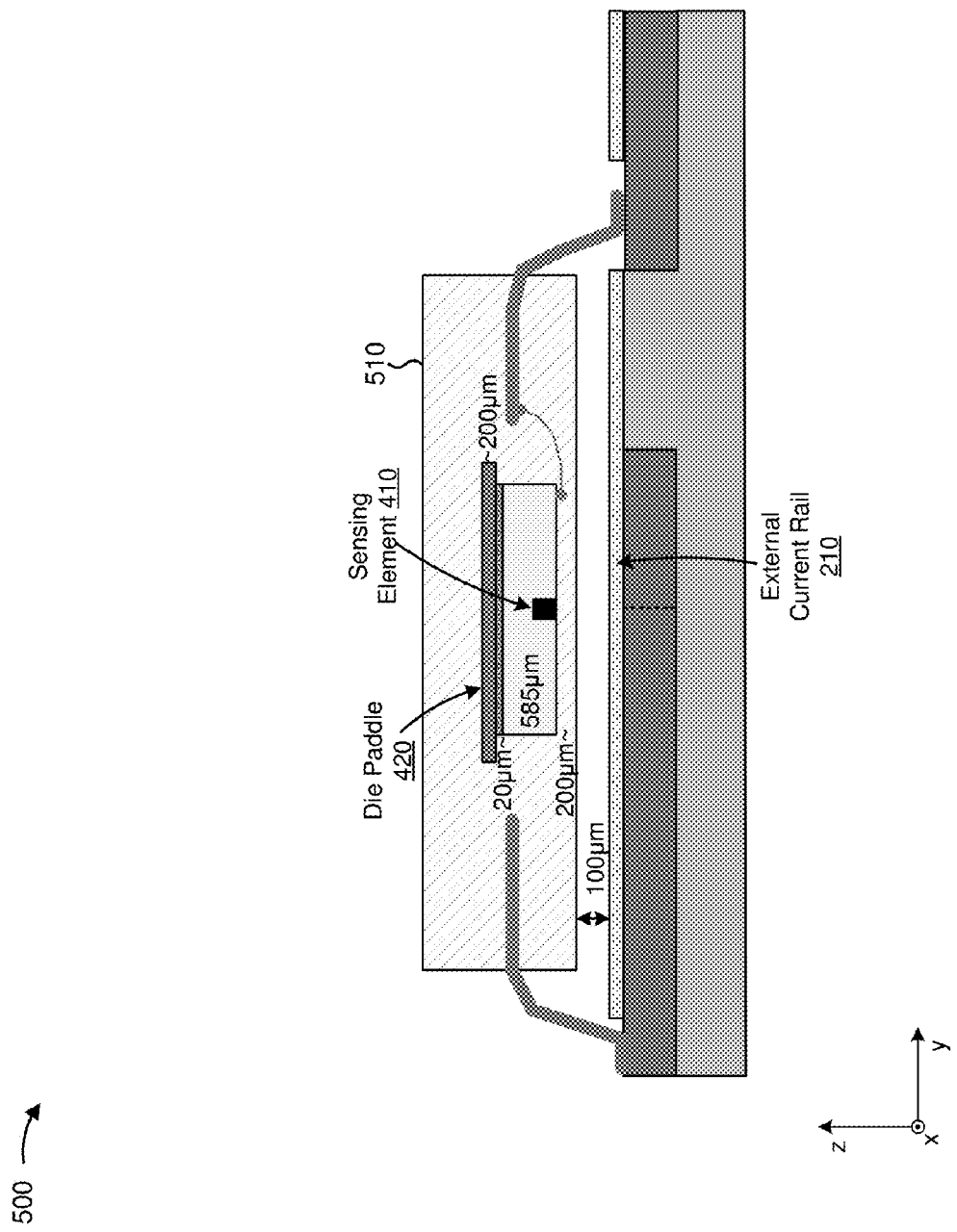
FIGS. 5A and 5B are diagrams of an example geometry of a magnetic current sensor that includes a notched die paddle designed to balance an eddy current effect and a skin effect on a magnetic field sensed by the magnetic current sensor.
Figure 5B:
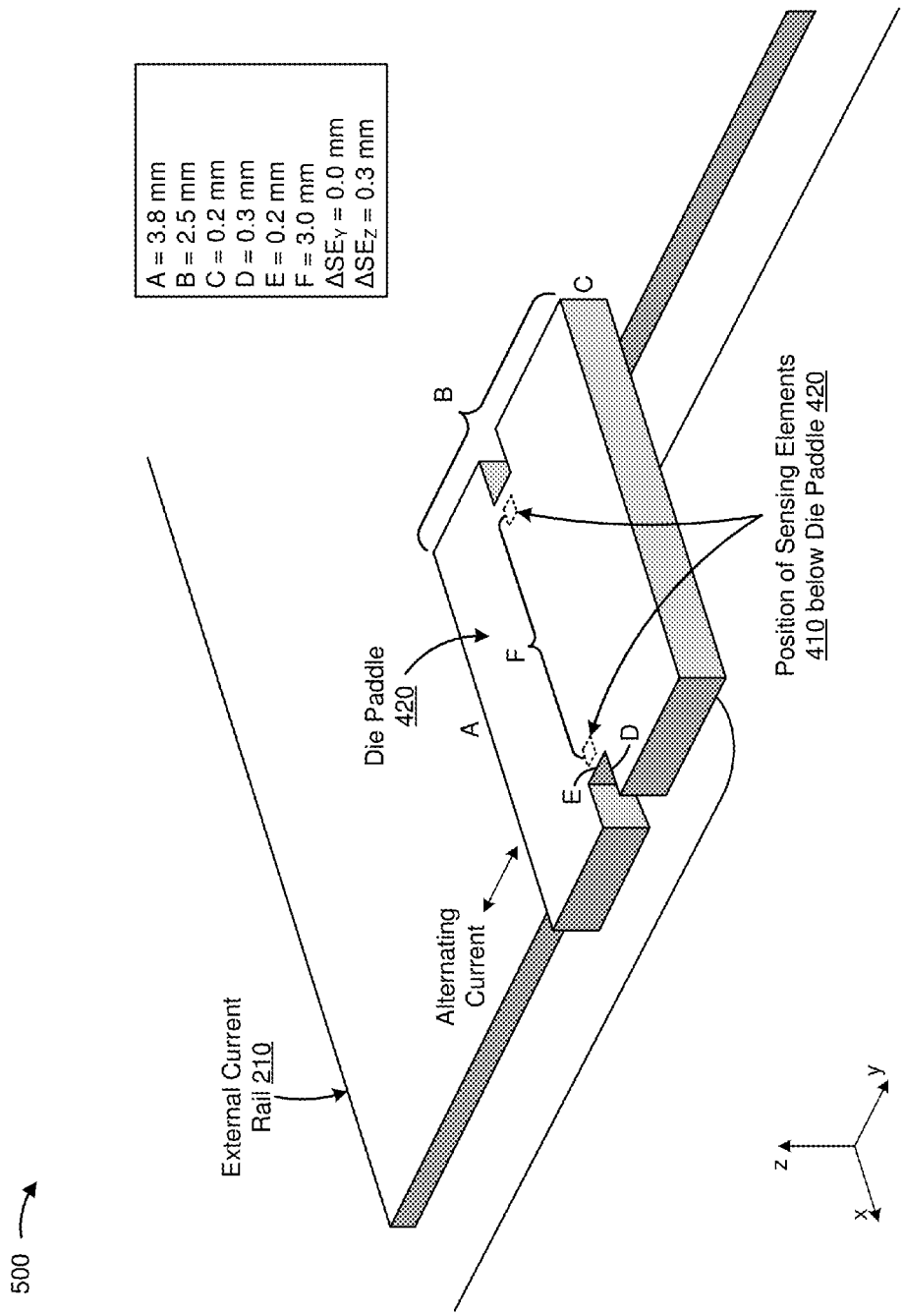

FIGS. 5A and 5B are diagrams of an example geometry 500 of magnetic current sensor 220 that includes a notched die paddle 420 designed to balance an eddy current effect with a skin effect on a magnetic field sensed by magnetic current sensor 220. For the purposes of example geometry 500, assume that magnetic current sensor 220 includes a pair of sensing elements 410 and die paddle 420, and that magnetic current sensor 220 is attached to a PCB such that a portion of external current rail 210 of the PCB is beneath magnetic current sensor 220.

FIG. 5A is a diagram of an example cross section of magnetic current sensor 220. As shown by FIG. 5A, die paddle 420 may have a thickness of 200 micrometers (μm) (e.g., 0.2 millimeters (mm)), and may be attached (e.g., via 20 μm thickness of a non-conductive glue) to silicon die, preferably comprising an integrated circuit. The silicon die may have a thickness of 585 μm, that includes a pair of sensing elements 410 positioned on a bottom face of the silicon die. As shown, die paddle 420 and the integrated circuit (e.g., including the pair of sensing elements 410) may be housed in a sensor package 510. As shown, within sensor package 510, the sensing elements may be positioned 300 μm above external current rail 210 (e.g., including a 100 μm air gap and 200 μm of the sensor mold). In some implementations, die paddle 420 may be designed to reduce an eddy current effect on a magnetic field sensed by the pair of sensing elements 410 (e.g., such that the eddy current effect balances with a skin effect on the magnetic field), as described below.

FIG. 5B is a diagram of an example geometry of die paddle 420 designed to reduce an eddy current effect on a magnetic field sensed by sensing elements 410 to balance the eddy current effect with the skin effect. Die paddle 420 of FIG. 5B may correspond to die paddle 420 shown in FIG. 5A included in sensor package 510 (for purposes of clarity, other components of magnetic current sensor 220 have been omitted from FIG. 5B). As shown in FIG. 5B, die paddle 420 (e.g., included in sensor package 510 of magnetic current sensor 220) may be positioned above the portion of external current rail 210 that is beneath magnetic current sensor 220.

The pair of sensing elements of 410 of magnetic current sensor 220 may be positioned below die paddle 420 (e.g., as shown in FIG. 5A). As shown, the pair of sensing elements 410 may be similarly positioned with respect to a y-axis (e.g., $\Delta SE_Y$=0.0 mm) and may be separated from each other by a distance of 3.0 mm with respect to an x-axis (e.g., F=3.0 mm). As described above with regard to FIG. 5A, assume that the pair of sensing elements 410 is positioned 300 μm above the portion of external current rail 210 beneath magnetic current sensor 220 (e.g., $\Delta SE_Z$=0.3 mm).

As further shown, die paddle 420 may have a width of 3.8 mm (e.g., A=3.8 mm), a length of 2.5 mm (e.g., B=2.5 mm), and a thickness of 0.2 mm (e.g., C=0.2 mm). As further shown, die paddle 420 may include a pair of notches that extend from the edges of die paddle 420 toward the pair of sensing elements 410. For example, each notch may extend from an edge of die paddle 420 that is substantially parallel to the current passing through the portion of external current rail 210 beneath magnetic current sensor 220, and toward each corresponding sensing element 410. As shown, each notch may have a width of 0.3 mm (e.g., D=0.3 mm) and a length of 0.2 mm (e.g., E=0.2 mm).

As such, each notch may extend from an edge of die paddle 420 toward a corresponding sensing element 410 for a distance that is approximately equal to 75% of a distance between the edge of die paddle 420 and the corresponding sensing element 410. For example, from the geometry of die paddle 420, it follows that each sensing element 410 (e.g., sensing element 410 and sensing element 420) may be positioned approximately 0.4 mm from the edge of die paddle 420 with respect to an x-axis (e.g., (3.8 mm−3.00 mm)/2=0.4 mm). Here, the width of each notch is a distance equal to 75% of the distance between the edge of die paddle 420 and each corresponding sensing element (e.g., 0.3 mm/0.4 mm=0.75=75%). In some implementations, the notches may be etched into die paddle 420.

As indicated above, FIGS. 5A and 5B are provided merely as an example. In other words, all widths, distances, values, and the like, associated with example geometry 500 are provided merely as examples to facilitate an understanding of how to construct the die paddle notches of die paddle 420. Other examples are possible and may differ from what was described with regard to FIGS. 5A and 5B.

Figure 6:
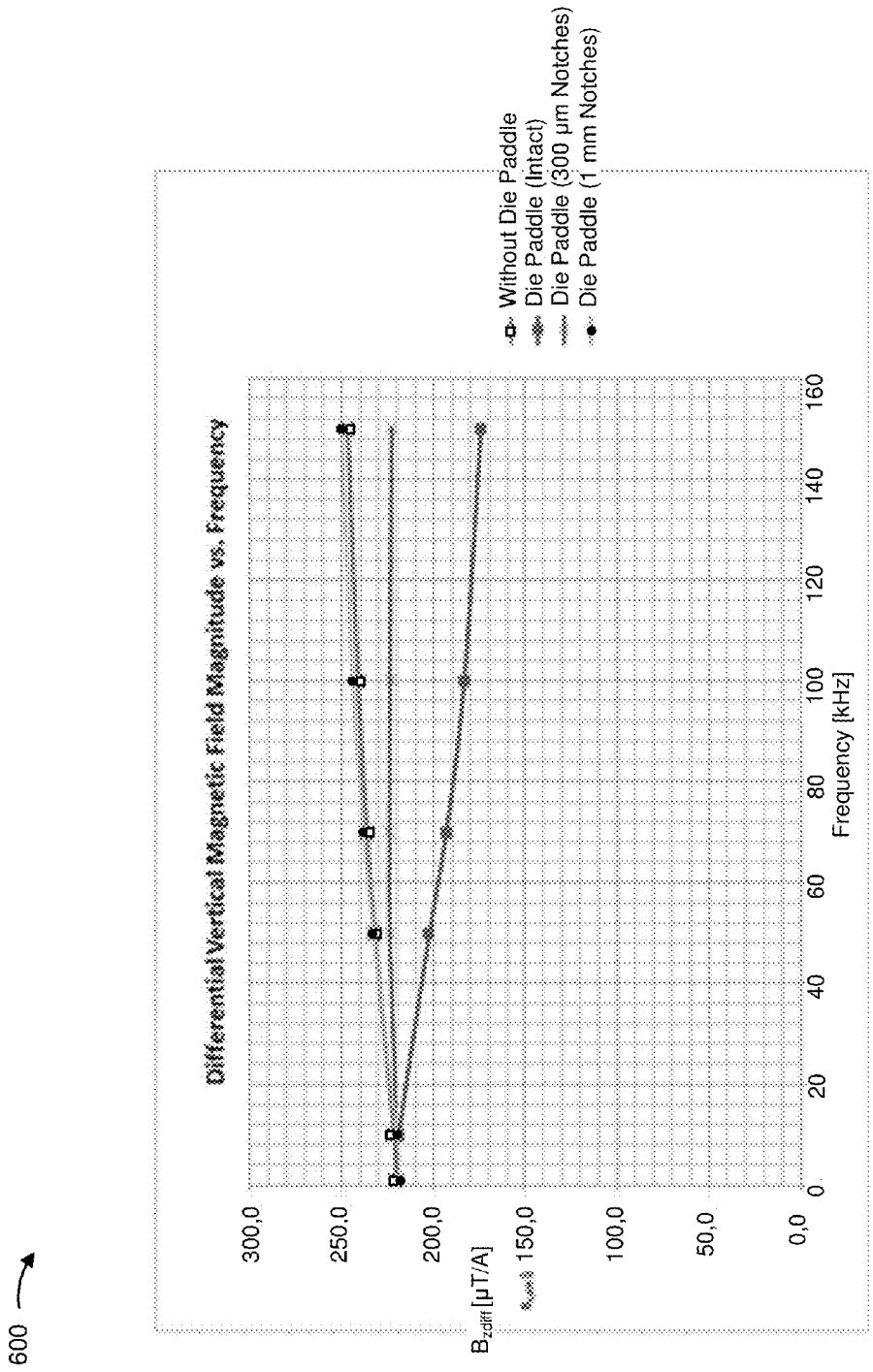
FIG. 6 is a graphical representation showing how a notched die paddle may reduce an eddy current effect to balance with a skin effect on a magnetic field sensed by a magnetic current sensor to allow a frequency dependence of the magnetic current sensor to be reduced.

FIG. 6 is a graphical representation 600 showing how a notched die paddle 420 may reduce an eddy current effect to balance with a skin effect on a magnetic field sensed by magnetic current sensor 220 to allow a frequency dependence of magnetic current sensor 220 to be reduced. For the purposes of FIG. 6, assume that an alternating current is passing through the portion of external current rail 210 beneath magnetic current sensor 220.

As described above, if magnetic current sensor 220 does not include die paddle 420, then the skin effect may cause the amplitude of the magnetic field (e.g., $B_{zdiff}$, measured in microTeslas/Amp (µT/A)) as sensed by sensing elements 410, to inaccurately represent the current. In fact the amplitude of the magnetic field then is to increase. As shown by the "Without Die Paddle" line of FIG. 6, the skin effect may have a greater impact as the frequency of current increases, as the amplitude of the differential magnetic field increases for a die paddle without notches (see FIG. 5) as the frequency increases. In other words, as the frequency of the alternating current increases, the skin effect may become greater, which may lead to an increase in the sensed magnetic field even though the amplitude of current may not increase.

However, as described above, if magnetic current sensor 220 includes an intact die paddle 420 (e.g., a die paddle without notches), then the eddy current effect may cause the amplitude of the magnetic field to inaccurately represent the current by causing the amplitude of the magnetic field to decrease. As shown by the "Die Paddle (Intact)" line of FIG. 6, the eddy current effect may also have a greater impact as the frequency of the current increases: the amplitude of the magnetic field decreases as the frequency increases). In other words, as the frequency of the alternating current increases, the eddy current effect may become greater, which may lead to a decrease in the sensed magnetic field that outweighs the skin effect.

Now, assume that magnetic current sensor 220 includes die paddle 420 with notches as described above with regard to FIGS. 5A and 5B. As shown by the "Die Paddle (300 µm Notches)" line of FIG. 6, due to the notches included in die paddle 420, the amplitude of the magnetic field, sensed by sensing elements 410, remains relatively constant (e.g., between approximately 220 µT/A and 230 µT/A) across a range of frequencies (e.g., from approximately 1 kHz to approximately 150 kHz) as can be taken from FIG. 6. Here, the eddy currents are distorted around the die paddle notches in a manner similar to that shown in FIG. 1B which will then balance the skin effect. Such a balancing behavior corresponds to the sweet spot described above. In other words, the die paddle notches may cause a coupling factor, associated with converting the current to a differential magnetic field value, to be approximately frequency independent (e.g., ~220 µT/A) due to the substantial balancing of eddy currents and skin effect.

As such, the notches may reduce the eddy current effect to balance with the skin effect (e.g., such the eddy current effect may cancel out and/or offset the skin effect such that a net effect on the magnetic field is approximately 0). In some implementations, as described above, a width of the notches (e.g., a distance between a closest edge of die paddle 420 and a center of sensing element 410) may be determined based on a set of geometry factors and/or a set of material factors associated with magnetic current sensor 220 and/or die paddle 420.

In some implementations, the notches of die paddle 420 may be designed in order to substantially remove the eddy current effect (e.g., rather than balance the eddy current effect with the skin effect). For example, as shown by the "Die Paddle (1 mm Notches)" line of FIG. 6, if the width of the die paddle notches are extended to and/or past a position of sensing elements 410 (e.g., from 300 µm to 1 mm in the case of FIGS. 5A and 5B), then the eddy current effect may be substantially removed (e.g., such that the amplitude of the magnetic field may behave similar to a scenario in which magnetic current sensor 220 does not include die paddle 420).

As indicated above, FIG. 6 is provided merely as an example. Other examples are possible and may differ from what was described with regard to FIG. 6.

Figure 7A:
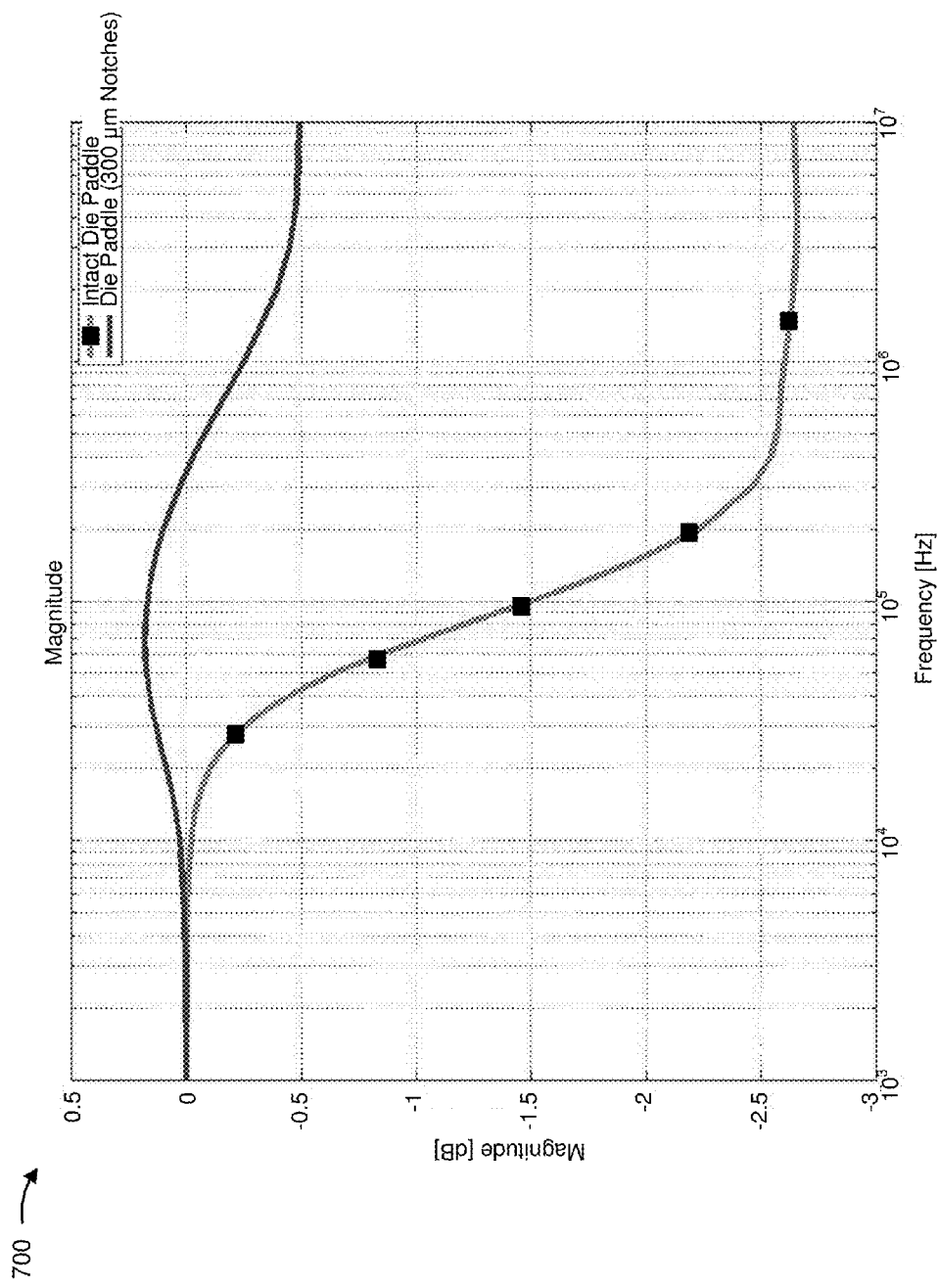
FIGS. 7A-7C are graphical representations showing comparisons of effects on a magnetic current sensor that includes a notched die paddle versus a magnetic current sensor that includes an intact die paddle.
Figure 7B:
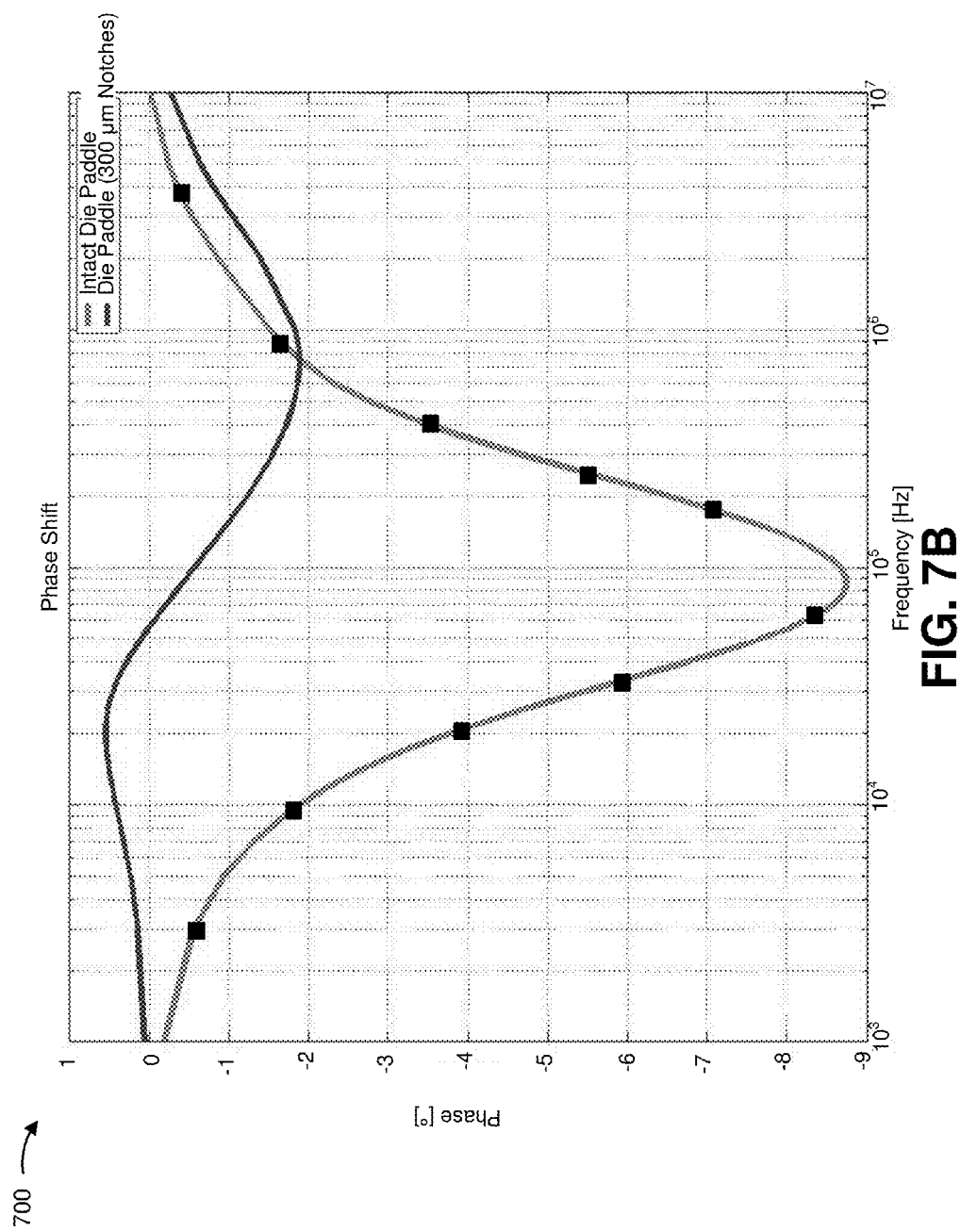
Figure 7C:
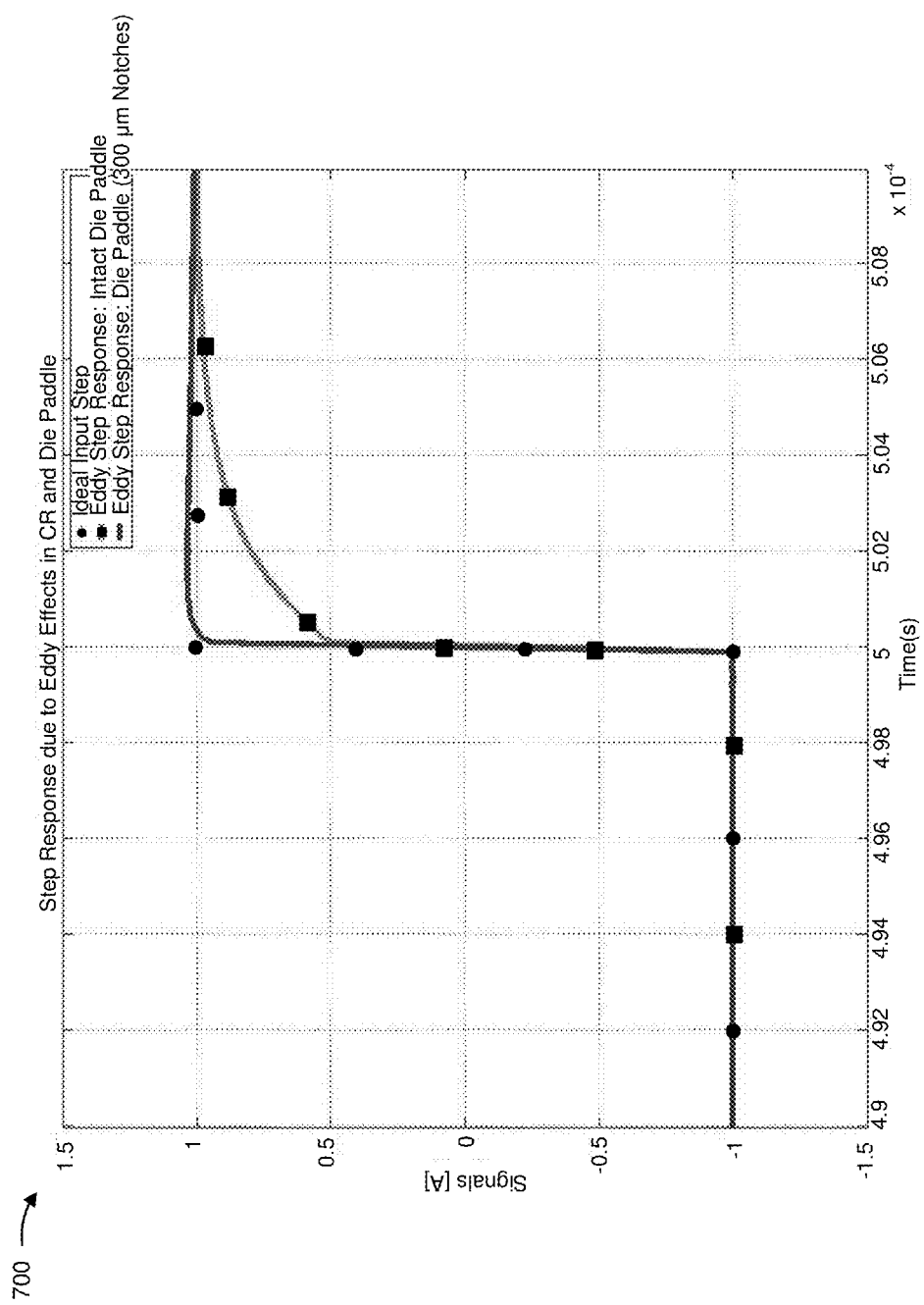

FIGS. 7A-7C are graphical representations 700 showing comparisons of effects on magnetic current sensor 220 that includes a notched die paddle 420 (solid squares in FIG. 7A) versus magnetic current sensor 220 that includes an intact die paddle 420 (e.g., a die paddle without notches—solid line without symbols in FIG. 7A). For the purposes of FIGS. 7A-7C, assume that the notched die paddle 420 corresponds to that described above with regards to FIGS. 5A and 5B.

As shown by the "Intact Die Paddle" line in FIG. 7A, as the frequency of the current increases from approximately 1 kHz (i.e., $10^3$ Hz) to approximately 10 MHz (i.e., $10^7$ Hz), an amount of attenuation (e.g., in decibels (dB)) associated with the amplitude of the magnetic field may increase. For example, for a current with a frequency of 10 MHz, magnetic current sensor 220 may experience approximately 2.7 dB of attenuation associated with the magnetic field in comparison to the amplitude at 1 kHz. However, as shown by the "Die Paddle (300 µm) Notches" line in FIG. 7A, the attenuation associated with the amplitude of the magnetic field may be reduced when magnetic current sensor 220 includes a notched die paddle 420. For example, if die paddle 420 includes a pair of 300 µm notches (e.g., as described with regard to FIGS. 5A and 5B), then the attenuation at 10 MHz may be reduced to approximately 0.5 dB (relative to the amplitude at 1 kHz), as compared to an attenuation of approximately 2.7 dB (relative to the amplitude at 1 kHz) for an intact die paddle 420.

As another example illustrated by FIG. 7A, the intact die paddle 420 experiences 1.5 dB of attenuation at 100 kHz (relative to the amplitude at 1 kHz), which may be a significant limitation on an overall bandwidth of magnetic current sensor 220. However, the notched die paddle 420 does not experience attenuation at 100 kHz (relative to the amplitude at 1 kHz) and therefore effectively removes the bandwidth limitation caused by eddy current effect associated with the intact die paddle 420. Notably, the notched die paddle 420 may not alleviate bandwidth limitations of magnetic current sensor 220 caused by one or more other factors, such as a decrease in sensor bandwidth caused by a Hall-effect, ADC 320, an amplifier, an analog filter, and/or a digital filter, or the like.

Similarly, as shown by the "Intact Die Paddle" line in FIG. 7B, as the frequency of the current increases from approximately 1 kHz to approximately 10 MHz, a phase shift, associated with the magnetic field, may widely vary. For example, for a current with a frequency component of 100 kHz (i.e., $10^5$ Hz), magnetic current sensor 220 may experience approximately nine degrees of phase shift associated with the magnetic field. However, as shown by the "Die Paddle (300 μm) Notches" line in FIG. 7B, the phase shift associated with the magnetic field may be reduced when magnetic current sensor 220 includes the notched die paddle 420. For example, if die paddle 420 includes a pair of 300 μm notches (e.g., as described with regard to FIGS. 5A and 5B), then the phase shift at 100 kHz may be reduced to approximately 0.5 degrees. The phase shift may similarly be reduced for other frequencies between 100 kHz and 10 MHz as can be taken from a comparison of the intact die paddle values (solid squares in FIG. 7B) with the solid line for the die paddle with the 300 μm notches (line without symbols in FIG. 7B).

However, for frequencies higher than about $8 \times 10^5$ Hz, the phase shift is no longer reduced by the die paddle with 300 μm notches in comparison to the intact die paddle. This fact gives a first estimate on how wide the extended sweet spot mentioned above is for the 300 μm notches die paddle.

As shown in FIG. 7C, when interpreting the reduced loss and the reduced phase shift due to the inclusion of the notches, a step response associated with a signal that represents the current changing direction may also be improved. For example, as shown by the "Eddy Step Response: Intact Die Paddle" solid squares of FIG. 7C, if magnetic current sensor 220 includes the intact die paddle 420, then the step response of the signal may experience a delay in reaching a level that represents the current. For example, upon a switch in direction of the current from a first direction to a second (e.g., opposite) direction, the eddy current effect may allow the magnetic field signal (shown in arbitrary units) to quickly (e.g., in less than one microsecond) jump from a level corresponding to the first direction (e.g., −1) to approximately half of a level corresponding to the second direction (e.g., 0.5), so 75% of the overall magnetic field jump happens abruptly with an almost vertical increase, while the step for the remaining 25% of the full amplitude are spread out over time. The signal may then slowly (e.g., over a period of approximately two microseconds) reach 90% of the overall step. Such a delay in the step response may be undesirable for purposes of providing over current protection (e.g., overcurrent protection may be delayed due to the delay in the step response), for accurately measuring the current, or the like.

However, as shown by the "Eddy Step Response: Die Paddle (300 μm) Notches" line of FIG. 7C (without symbols), if magnetic current sensor 220 includes the notched die paddle 420 (e.g., as described above with regard to FIGS. 5A and 5B), then the step response of the signal may be improved. As shown, upon the switch of the current from the first direction to the second direction, the eddy current effect may be reduced such that the signal may quickly (e.g., in less than 0.1 microsecond) jump to 90% of the overall step and 100% of the overall step in 0.3 microseconds (with an overshoot of approximately 1%, which diminishes within some μs-s), rather than slowly allowing the signal to increase to the second signal level. As shown by the "Ideal Input Step" line of FIG. 7C, the step response associated with the notched die paddle 420 may nearly match an "ideal" step response.

As indicated above, FIGS. 7A-7C are provided merely as examples. Other examples are possible and may differ from what was described with regard to FIGS. 7A-7C.

Implementations described herein may relate to a die paddle, included in a magnetic current sensor that includes notches designed to reduce an eddy current effect, caused by a current passing through a current rail, such that the eddy current effect balances with a skin effect caused by the current passing through the current rail. As such, the magnetic current sensor may accurately determine the current passing through the current rail in the presence of the eddy current effect and the skin effect. In some implementations, use of the notches may allow the magnetic current sensor to be virtually frequency independent such that the magnetic current sensor may function even when the high frequency content of the current is relatively significant (e.g., above 100 kilohertz (kHz), above 1 megahertz (MHz), etc.).

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A magnetic current sensor, comprising:
    a first sensing element to sense a first magnetic field value associated with a current passing through a portion of a current rail;
    a second sensing element to sense a second magnetic field value associated with the current passing through the portion of the current rail; and
    a die paddle positioned above or below the first sensing element and the second sensing element,
        the die paddle having a first edge and a second edge substantially parallel to a direction of the current,
            the first edge being closer to the first sensing element than the second sensing element, and
            the second edge being closer to the second sensing element than the first sensing element,
        the die paddle including a first notch extending from the first edge in a direction of the first sensing element and having a first width in a range of approximately 50 percent to approximately 100 percent of a distance between the first edge and the first sensing element, the die paddle including a second notch extending from the second edge in a direction of the second sensing element and having a second width in a range of approximately 50 percent to approximately 100 percent of a distance between the second edge and the second sensing element, and the first notch and the second notch causing a frequency dependence of an amplitude of a magnetic field to be reduced or a frequency dependence of a phase shift of the magnetic field to be reduced, the magnetic field being associated with the first magnetic field value and the second magnetic field value.

2. The magnetic current sensor of claim 1, where the first notch and the second notch are substantially identical in shape with respect to each other.

3. The magnetic current sensor of claim 1, where the die paddle includes a third edge and a fourth edge, where the first notch and the second notch are similarly positioned along the first edge and the second edge relative to the third edge and the fourth edge.

4. The magnetic current sensor of claim 1, where the directions of the first notch and the second notch are substantially perpendicular to the direction of the current passing through the portion of the current rail.

5. The magnetic current sensor of claim 1, where the first sensing element and the second sensing element are Hall-based sensing elements, giant magnetoresistance (GMR)-based sensing elements, anisotropic magnetoresistance (AMR)-based sensing elements, or tunnel magnetoresistance (TMR)-based sensing elements.

6. The magnetic current sensor of claim 1, where the magnetic current sensor is housed in a package comprising a semiconductor chip.

7. The magnetic current sensor of claim 1, where the first notch and the second notch are positioned to reduce an eddy current effect induced in the die paddle by the current passing through the portion of the current rail.

8. A magnetic current sensor, comprising:
a first sensing element to determine a first magnetic field value associated with a current passing through a portion of a current rail;
a second sensing element to determine a second magnetic field value associated with the current passing through the portion of the current rail; and
a die paddle positioned above or below the first sensing element and the second sensing element,
the die paddle having a first edge and a second edge substantially parallel to a direction of the current, the first edge being closer to the first sensing element than the second sensing element, and the second edge being closer to the second sensing element than the first sensing element,
the die paddle including a first notch extending from the first edge in a direction substantially perpendicular to the direction of the current and having a first width that is less than a distance between the first edge and the first sensing element,
the die paddle including a second notch extending from the second edge in a direction substantially perpendicular to the direction of the current and having a second width that is less than a distance between the second edge and the second sensing element, and
the first notch and the second notch causing a frequency dependence of an amplitude of a magnetic field to be reduced or a frequency dependence of a phase shift of the magnetic field to be reduced,
the magnetic field being associated with the first magnetic field value and the second magnetic field value.

9. The magnetic current sensor of claim 8, where the first notch and the second notch are rectangular shaped.

10. The magnetic current sensor of claim 8, where the first width and the second width are based on a length of the die paddle and a width of the die paddle.

11. The magnetic current sensor of claim 8, where the first width and the second width are based on a material of the portion of the current rail or a width of the portion of the current rail.

12. A magnetic sensor, comprising:
a first sensing element to determine a first magnetic field value associated with a current passing through a portion of a current rail;
a second sensing element to determine a second magnetic field value associated with the current passing through the portion of the current rail; and
a die paddle positioned above or below the first sensing element and the second sensing element,
the die paddle having a first edge and a second edge substantially parallel to a direction of the current, the first edge being closer to the first sensing element than the second sensing element, and the second edge being closer to the second sensing element than the first sensing element,
the die paddle including a first notch extending from the first edge in a direction substantially perpendicular to the direction of the current and having a first width that is approximately 75 percent of a distance between the first edge and the first sensing element, and
the die paddle including a second notch extending from the second edge in a direction substantially perpendicular to the direction of the current and having a second width that is approximately 75 percent of a distance between the second edge and the second sensing element, and
the first notch and the second notch causing a frequency dependence of an amplitude of a magnetic field to be reduced or a frequency dependence of a phase shift of the magnetic field to be reduced,
the magnetic field being associated with the first magnetic field value and the second magnetic field value.

13. The magnetic sensor of claim 12, where the first width and the second width are based on a vertical distance between the die paddle and the portion of the current rail.

14. The magnetic sensor of claim 12, where the first sensing element and the second sensing element form a differential sensor.

15. The magnetic sensor of claim 12, where the first notch and the second notch are substantially identical in shape with respect to each other.

16. The magnetic sensor of claim 12, where the die paddle includes a third edge and a fourth edge,
where the first notch and the second notch are similarly positioned along the first edge and the second edge relative to the third edge and the fourth edge.

17. The magnetic current sensor of claim 1, where the first width of the first sensing element is less than the distance between the first edge and the first sensing element, and where there the second width of the second sensing element is less than the distance between the second edge and the second sensing element.

18. The magnetic current sensor of claim 8, where the first notch and the second notch are positioned to reduce an eddy current effect induced in the die paddle by the current passing through the portion of the current rail.

19. The magnetic current sensor of claim 8, where the first sensing element and the second sensing element are Hall-based sensing elements, giant magnetoresistance (GMR)-based sensing elements, anisotropic magnetoresistance (AMR)-based sensing elements, or tunnel magnetoresistance (TMR)-based sensing elements.

20. The magnetic sensor of claim 12, where the first notch and the second notch are positioned to reduce an eddy current effect induced in the die paddle by the current passing through the portion of the current rail.

* * * * *